United States Patent
Kikuchi

(10) Patent No.: US 6,522,678 B2
(45) Date of Patent: Feb. 18, 2003

(54) MULTIPLE WAVELENGTH SEMICONDUCTOR LASER DEVICE ARRAY AND PRODUCTION METHOD

(75) Inventor: Kenichi Kikuchi, Miyagi (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/795,383

(22) Filed: Feb. 28, 2001

(65) Prior Publication Data
US 2001/0040906 A1 Nov. 15, 2001

(30) Foreign Application Priority Data

Mar. 1, 2000 (JP) .......................................... 2000-056223
May 1, 2000 (JP) .......................................... 2000-132628

(51) Int. Cl.$^7$ .............................. H01S 3/10; H01S 5/00; H01S 3/14

(52) U.S. Cl. .............................. 372/49; 372/68; 372/43; 372/23

(58) Field of Search ............................... 372/23, 49, 50, 372/43, 68

(56) References Cited

U.S. PATENT DOCUMENTS 4,993,036 A * 2/1991 Ikeda et al. ................... 372/50

* cited by examiner

Primary Examiner—Paul Ip
Assistant Examiner—Armando Rodriguez
(74) Attorney, Agent, or Firm—Sonnenschein, Nath & Rosenthal

(57) ABSTRACT

The present invention provides a multiple wavelength semiconductor laser device array having approximately the same optical output levels of inducing kink and COD. The multiple wavelength semiconductor laser device array has the same construction as that of a conventional two-wavelength semiconductor laser device array except the thickness of the reflection films at the light emitting end faces. The thickness of the reflection films deposited on the light emitting end faces of the two-wavelength semiconductor laser device array is determined so as to have a lower reflectivity at a light emitting end face of a 650 nm band semiconductor laser device consisting of an AlGaInP type four-element compound semiconductor which may induce kink and COD more easily, than a reflectivity at a light emitting end face of a 780 nm band semiconductor laser device consisting of an AlGaAs type three-element compound semiconductor.

5 Claims, 3 Drawing Sheets

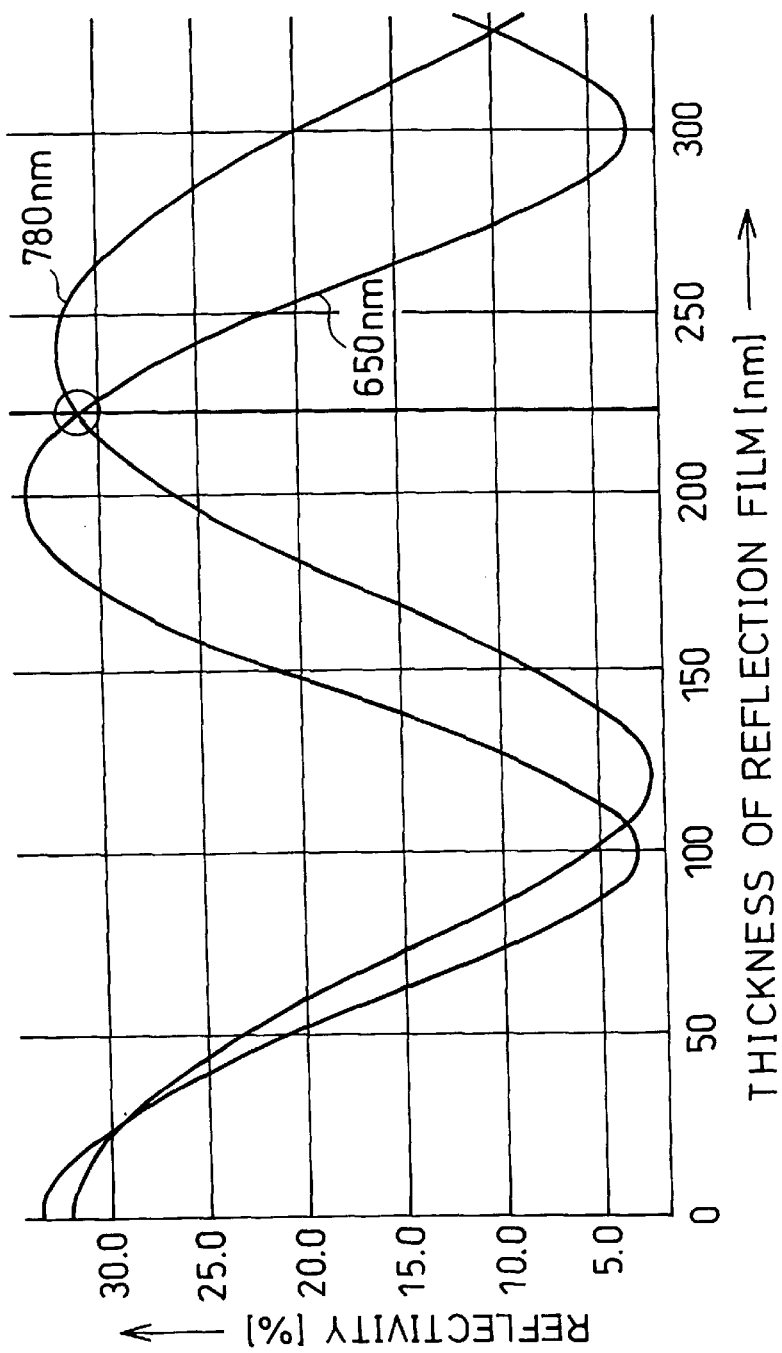

MULTIPLE WAVELENGTH SEMICONDUCTOR LASER DEVICE ARRAY AND PRODUCTION METHOD

The present invention claims priority from Japanese Patent Application No. 2000-132628, dated May 1, 2000, and Japanese Patent Application No. 2000-056223, dated Mar. 1, 2000, the entire contents of which are herein incorporated by reference.

BACKGROUND OF THE INVENTION

1. Field of the Invention

The present invention relates to a multiple wavelength semiconductor laser device array and its production method, and particularly to a multiple wavelength semiconductor laser device array having approximately the same optical output levels of inducing kink and catastrophic optical damage (COD), and a fabrication method of the multiple wavelength semiconductor laser device array.

2. Description of the Related Art

Recently, optical disks such as CD (compact disk), DVD (digital versatile disk) and MD (mini disk) for storing information optically are frequently used as a high capacity storage medium capable of storing a large amount of information.

Information may be recorded on the optical disks and reproduced from the optical disks via an optical pick-up apparatus. Due to differences in storage densities, an optical pick-up apparatus for reproduction of the CD uses 780 nm wavelength laser light while an optical pick-up apparatus for reproduction of the DVD uses 650 nm wavelength laser light.

Lately, a compatible optical disk apparatus has been commanding considerable attention. The compatible optical disk apparatus is equipped with an optical pick-up apparatus capable of reproducing both the CD and the DVD, to replace an optical disk apparatus dedicated for the CD to reproduce the CD, or an optical disk apparatus dedicated for the DVD to reproduce the DVD.

As one of such optical pick-up apparatuses, there has been developed an optical pick-up apparatus equipped with a 780 nm band semiconductor laser device consisting of an AlGaAs type three-element compound semiconductor emitting a laser light of 780 nm emission wavelength for reproducing the CD, and, a 650 nm band semiconductor laser device consisting of an AlGaInP type four-element compound semiconductor emitting a laser light of 650 nm emission wavelength for reproducing the CD.

Referring to FIG. 2, a two-wavelength semiconductor laser device array will now be explained. The two-wavelength semiconductor laser device array comprises a compound semiconductor substrate, and a 780 nm band semiconductor laser device consisting of an AlGaAs type three-element compound semiconductor and a 650 nm band semiconductor laser device consisting of an AlGaInP type four-element compound semiconductor. Both semiconductor laser devices are fabricated on the compound semiconductor substrate. FIG. 2 is a perspective view showing an overview of the two-wavelength semiconductor laser device array. For the sake of simplicity, an apparatus which comprises two semiconductor laser devices of a chip form monolithically disposed on the same substrate in parallel direction as shown in FIG. 2, is called a two-wavelength semiconductor laser device array in the instant specification.

As shown in FIG. 2, the two-wavelength semiconductor laser device array 10 comprises an embedded gain guide type 780 nm band semiconductor laser device 12 and an air ridge gain guide type 650 nm band semiconductor laser device 14. Both semiconductor laser devices 12 and 14 are monolithically fabricated on the same compound semiconductor substrate 18 with being separated by a separation groove 16.

Furthermore, a reflection film 20 is deposited at light emitting end faces of the both semiconductor laser devices 12 and 14 by depositing aluminum oxide ($Al_2O_3$).

However, there are problems in the above cited two-wavelength semiconductor laser device array 10 as follows.

One of the problems is that the 650 nm band semiconductor laser device consisting of AlGaInP type four-element compound semiconductor yields a lower optical output level at which a kink of an input-current vs. optical-output characteristic is observed in comparison with that of the 780 nm band semiconductor laser device consisting of AlGaAs type three-element compound semiconductor. That is, an input-current is limited to a small amount.

Furthermore, the 650 nm band semiconductor laser device also yields a lower optical output level at which COD (catastrophic optical damage) is induced in comparison with that of the 780 nm band semiconductor laser device.

Accordingly, it is difficult to operate both the 780 nm band semiconductor laser device and the 650 nm band semiconductor laser device together at the same optical output.

SUMMARY OF THE INVENTION

An object of the present invention is to provide a multiple wavelength semiconductor laser device array having the same or approximately the same optical output levels of inducing kink and COD, and a fabrication method of the multiple wavelength semiconductor laser device array.

The conventional two-wavelength semiconductor laser device array was examined for what was causing the lower optical output levels at which the kink and the COD are induced in the 650 nm band semiconductor laser device in comparison with the 780 nm band semiconductor laser device, and it was determined that one of the causes was due to an approximately same reflectivity at light emitting end faces of both the semiconductor laser devices.

In the conventional two-wavelength semiconductor laser device array 10, a thickness of the reflection film 20 is determined to have the same reflectivity at the light emitting end faces of the 780 nm band semiconductor laser device and the 650 nm band semiconductor laser device. For example, as shown in FIG. 3, the thickness of the reflection film in the conventional two-wavelength semiconductor laser device array 10 may be selected to 225 nm whereby reflectivities of both the 780 nm band semiconductor laser device and the 650 nm band semiconductor laser device are 31%. FIG. 3 is a graph showing a relationship between the thickness of reflection film at the light emitting end face and the reflectivity.

The present invention is achieved through experiments, and enables to provide the following to resolve the above-cited shortcomings. Namely, according to the present invention, it is found that the optical output level inducing the kink may be set to the same or approximately the same as the optical output level inducing the COD by adjusting a thickness of the reflection film fabricated on the light emitting end faces without any structural modification of a multiple wavelength semiconductor laser device array. More particularly, the above cited shortcomings may be resolved by setting the reflection film thickness so as to have a higher reflectivity at the light emitting end face of a shorter emission wavelength semiconductor laser device and a lower reflectivity at the light emitting end face of a longer emission wavelength semiconductor laser device.

The object of the present invention may be achieved by a multiple wavelength semiconductor laser device array comprising a plurality of semiconductor laser devices of an end face emission type, emitting laser lights with wavelengths different from one another, the plurality of semiconductor laser devices being disposed on the same substrate, wherein a reflectivity at a light emitting end face in one of the plurality of semiconductor laser devices (called a first semiconductor laser device, hereafter) is less than that of another of the plurality of semiconductor laser devices (called a second semiconductor laser device, hereafter) an emission wavelength of the second semiconductor laser device being longer than that of the first semiconductor laser device.

The optical output level inducing the kink and the optical output level inducing the COD in the first semiconductor laser device may be increased by decreasing the reflectivity at the end face of the first semiconductor laser device (the shorter wavelength semiconductor laser device).

Furthermore, an operation current $I_{op}$ and a threshold current $I_{th}$ in the second semiconductor laser device may be decreased by increasing the reflectivity at the end face of the second semiconductor laser device (the longer wavelength semiconductor laser device).

In accordance with an embodiment of the present invention, a thickness of the reflection films disposed on the light emitting end faces of the first semiconductor laser device and the second semiconductor laser device are selected so as to have the same value while the reflectivity at the light emitting end faces of the first semiconductor laser device is less than that of the second semiconductor laser device.

The present invention does not constrain a type of the reflection film nor its composition. For example, a deposition film of aluminum oxide ($Al_2O_3$) may be employed as the reflection film on the light emitting end face when a 650 nm band semiconductor laser device consisting of AlGaInP type four-element compound semiconductor and a 780 nm band semiconductor laser device consisting of AlGaAs type three-element compound semiconductor are used as the first semiconductor laser device and the second semiconductor laser device, respectively.

In accordance with another embodiment of the present invention, a fabrication method of a multiple wavelength semiconductor laser array is provided. In the fabrication method of the present embodiment, the multiple wavelength semiconductor laser array comprises a plurality of semiconductor laser devices of an end face emission type, emitting laser lights with wavelengths different from one another, the plurality of semiconductor laser devices being disposed on the same substrate.

The fabrication method comprises a step of disposing reflection films on a light emitting end face of the multiple wavelength semiconductor laser array, wherein the step of disposing reflection films includes the steps of:

determining a thickness of the reflection films disposed on the light emitting end faces in one of the plurality of semiconductor laser devices (a first semiconductor laser device) and another of the plurality of semiconductor laser devices (a second semiconductor laser device) being the same value while the reflectivity at the light emitting end faces of the first semiconductor laser device is less than that of the second semiconductor laser device, and fabricating the reflection films by depositing material to be the reflection films on the light emitting end face of the multiple wavelength semiconductor laser device array so as to have the determined thickness.

Alternatively, the reflection film deposition may be carried out by utilizing a vacuum evaporation technology.

Furthermore, the reflection films for the plurality of semiconductor laser devices may be fabricated individually or as a single film like the conventional reflection film 20 (see FIG. 2) covering the light emitting side end face of the multiple wavelength semiconductor laser device array.

BRIEF DESCRIPTION OF THE DRAWINGS

The invention is herein described, by way of example only, with reference to the accompanying drawings, wherein:

FIG. 3 is a graph chart illustrating a thickness of a reflection film deposited on a light emitting end face of a conventional two-wavelength semiconductor laser device array.

DESCRIPTION OF THE PREFERRED EMBODIMENTS

Figure 1:
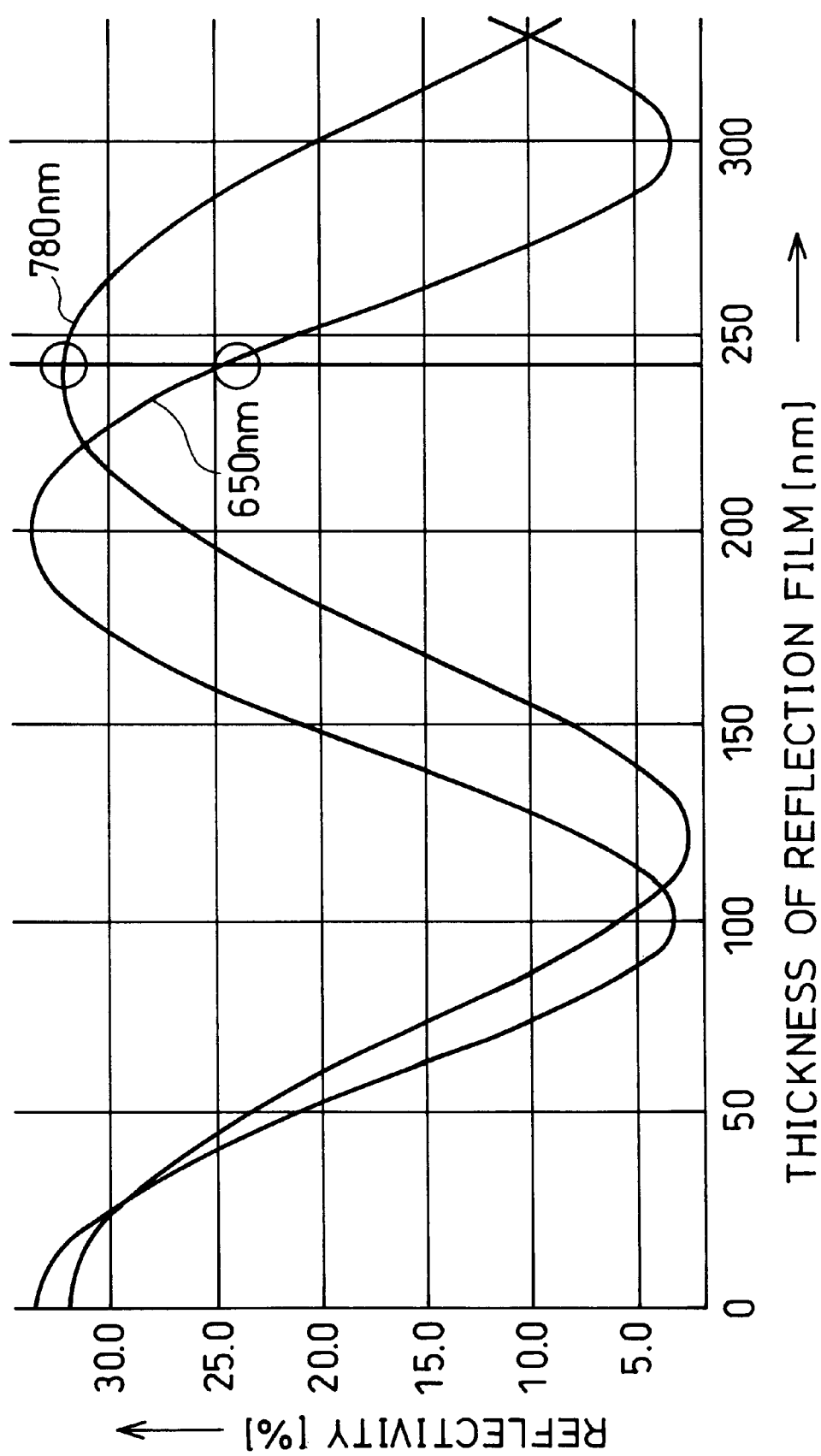
FIG. 1 is a graph chart illustrating a thickness of a reflection film deposited on a light emitting end face of a two-wavelength semiconductor laser device array in accordance with an embodiment of the present invention.
Figure 2:
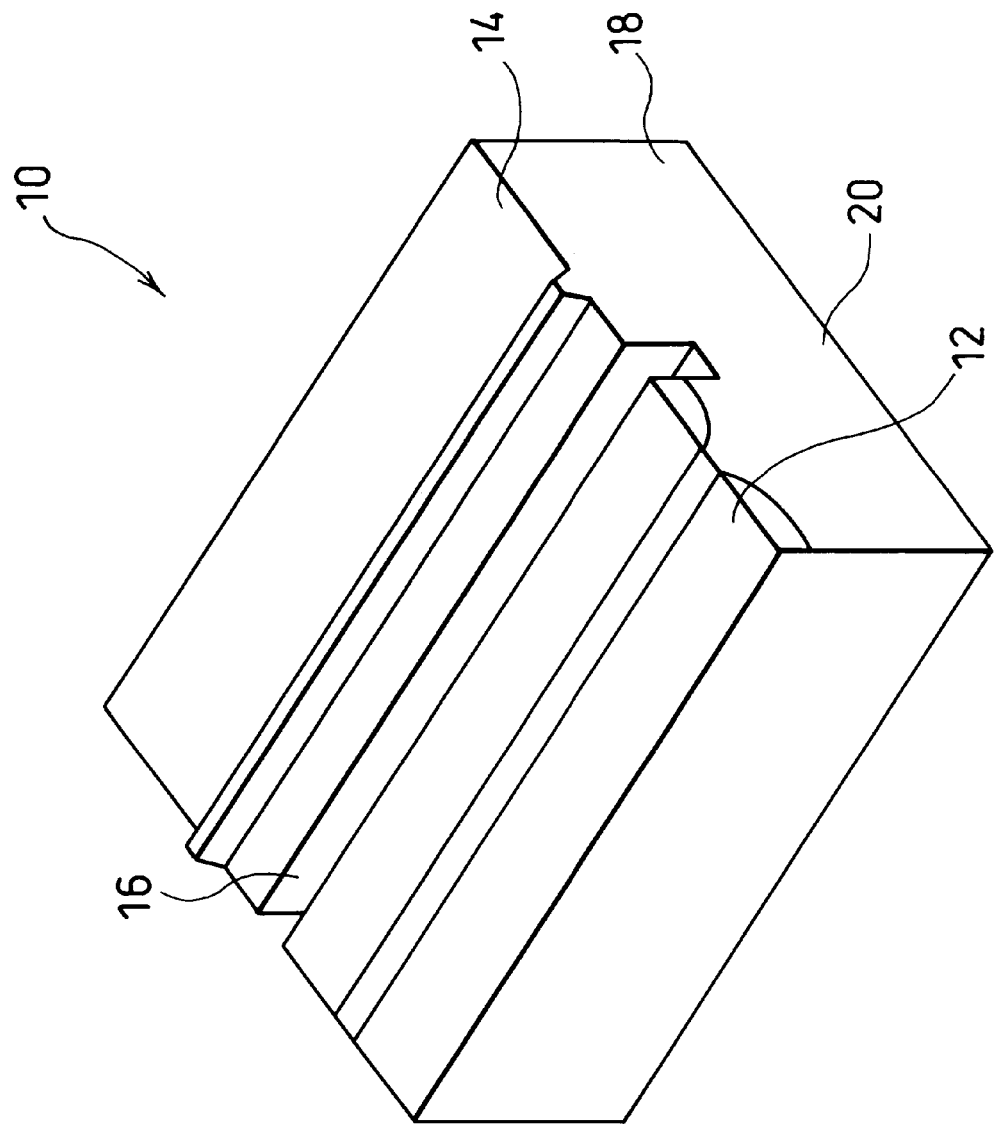
FIG. 2 is a perspective overview of a two-wavelength semiconductor laser device array.

An embodiment of the present invention will now be explained with reference to FIG. 1. In the present embodiment, a two-wavelength semiconductor laser device array is used as an example of a multiple wavelength semiconductor laser device array in accordance with the present invention. FIG. 1 is a graph chart illustrating a relationship between thicknesses of a reflection film deposited on a light emitting end face of the two-wavelength semiconductor laser device array in accordance with the present embodiment.

The two-wavelength semiconductor laser device array of the present embodiment has the same construction as the conventional two-wavelength semiconductor laser device array 10 except a thickness of the reflection film at the light emitting end face.

In the present embodiment, the thickness of the reflection film deposited on the light emitting end face of the two-wavelength semiconductor laser device array is determined so as to have a lower reflectivity at a light emitting end face of a 650 nm band semiconductor laser device consisting of an AlGaInP type four-element compound semiconductor inducing kink and COD more easily, than a reflectivity at alight emitting end face of a 780 nm band semiconductor laser device consisting of an AlGaAs type three-element compound semiconductor.

For example, referring to the graph showing a relationship between the reflection film thickness and the reflectivity, the reflection film thickness of 224 nm or about 224 nm may be selected so as to have the reflectivity of 24% at the light emitting end face of the 650 nm band semiconductor laser device 14 and the reflectivity of 32% at the light emitting end face of the 780 nm band semiconductor laser device 12.

The reflection film with a thickness of 224 nm or about 224 nm may be fabricated by depositing Aluminum oxide ($Al_2O_3$) in single deposition process.

Measurement of laser characteristics of the 650 nm band semiconductor laser device 14 of the instant example reveal an increase of both the optical output level inducing kink and the optical output level inducing COD to 10–15%. In other words, kink and COD are not induced even at an optical output level 10–15% higher than that of the conventional art.

Furthermore, measurements of laser characteristics of the 780 nm band semiconductor laser device 12 of the instant example reveal that it is possible to decrease $I_{op}$ and $I_{th}$.

According to the present invention, it is possible to realize a multiple wavelength semiconductor laser device array having the same or approximately the same optical output levels of inducing the kink and the COD by setting a reflectivity of light emitting end face of a first semiconductor laser device (the shorter wavelength semiconductor laser device) lower than that of a second semiconductor laser device (the longer wavelength semiconductor laser device).

In the present invention, the optical output level inducing the kink and the optical output level inducing the COD of the first semiconductor laser device may be increased by reducing the reflectivity at the light emitting end face of the first semiconductor laser device (the shorter wavelength semiconductor laser device). Furthermore, $I_{op}$ and $I_{th}$ of the second semiconductor laser device may be reduced by increasing the reflectivity at the light emitting end face of the second semiconductor laser device (the longer wavelength laser device).

What is claimed is:

1. A multiple wavelength semiconductor laser device array comprising:

a plurality of semiconductor laser devices of an end face emission type, emitting laser lights with wavelengths different from one another, said plurality of semiconductor laser devices being disposed on a same substrate;

wherein a reflectivity at a light emitting end face in a first semiconductor laser device of said plurality of semiconductor laser devices is less than that of a second semiconductor laser device of said plurality of semiconductor laser devices, an emission wavelength of said second semiconductor laser device being longer than that of said first semiconductor laser device;

wherein a thickness of said reflection films disposed on the light emitting end faces of said first semiconductor laser device and said second semiconductor laser device are selected so as to have a same value while the reflectivity at the light emitting end faces of said first semiconductor laser device is less that that of said second semiconductor laser device.

2. The multiple wavelength semiconductor laser device array according to claim 1 wherein:

said reflection films are fabricated on the light emitting end faces by a deposition method.

3. A multiple wavelength semiconductor laser device array comprising:

a plurality of semiconductor laser devices of an end face emission type, emitting laser lights with wavelengths different from one another, said plurality of semiconductor laser devices being disposed on a same substrate;

wherein a reflectivity at a light emitting end face in a first semiconductor laser device of said plurality of semiconductor laser devices is less than that of a second semiconductor laser device of said plurality of semiconductor laser devices, an emission wavelength of said second semiconductor laser device being longer than that of said first semiconductor laser device;

wherein said multiple wavelength semiconductor laser device array is a two-wavelength semiconductor laser device array, said first semiconductor laser device is a 650 nm band semiconductor laser consisting of an AlGaInP type four-element compound semiconductor; and said second semiconductor laser device is a 780 nm band semiconductor laser consisting of an AlGaAs type three-element compound semiconductor; and wherein a thickness of said reflection films disposed on the light emitting end faces of said first semiconductor laser device and said second semiconductor laser device are selected so as to have a same value while the reflectivity at the light emitting end faces of said first semiconductor laser device is less that that of said second semiconductor laser device.

4. The multiple wavelength semiconductor laser device array according to claim 2 wherein:

said reflection films at the light emitting end faces of said first semiconductor laser device and said second semiconductor laser device are reflection films fabricated by depositing aluminum oxide ($Al_2O_3$).

5. A fabrication method comprises at least a step of disposing reflection films on a light emitting end face of a multiple wavelength semiconductor laser array, wherein said step of disposing reflection films includes the steps of:

determining a thickness of said reflection films disposed on the light emitting end faces in a first semiconductor laser device of said plurality of semiconductor laser devices and a second semiconductor laser device of said plurality of semiconductor laser devices to be a same value while a reflectivity at the light emitting end faces of said first semiconductor laser device is less than that of said second semiconductor laser device, and fabricating said reflection films by depositing material to be said reflection films on the light emitting end faces of said multiple wavelength semiconductor laser device array so as to achieve said determined thickness.

* * * * *